US011378595B2

(12) United States Patent
Petersen et al.

(10) Patent No.: US 11,378,595 B2
(45) Date of Patent: Jul. 5, 2022

(54) LOW TEMPERATURE COEFFICIENT CURRENT SENSOR

(71) Applicant: Analog Devices International Unlimited Company, Limerick County (IE)

(72) Inventors: Michael D. Petersen, Elbert, CO (US); Kalin V. Lazarov, Colorado Springs, CO (US); Gregory J. Manlove, Colorado Springs, CO (US); Robert Chiacchia, Colorado Springs, CO (US)

(73) Assignee: Analog Devices International Unlimited Company, Limerick County (IE)

( * ) Notice: Subject to any disclaimer, the term of this patent is extended or adjusted under 35 U.S.C. 154(b) by 0 days.

(21) Appl. No.: 17/283,860

(22) PCT Filed: Oct. 30, 2019

(86) PCT No.: PCT/US2019/058920
§ 371 (c)(1),
(2) Date: Apr. 8, 2021

(87) PCT Pub. No.: WO2020/096840
PCT Pub. Date: May 14, 2020

(65) Prior Publication Data
US 2021/0382091 A1 Dec. 9, 2021

Related U.S. Application Data

(60) Provisional application No. 62/755,881, filed on Nov. 5, 2018.

(51) Int. Cl.
*G01R 15/14* (2006.01)
*G01R 19/32* (2006.01)

(52) U.S. Cl.
CPC .......... *G01R 15/146* (2013.01); *G01R 19/32* (2013.01)

(58) Field of Classification Search
CPC ....... G01R 15/146; G01R 19/32; G01R 1/203
(Continued)

(56) References Cited

U.S. PATENT DOCUMENTS 8,278,909 B2   10/2012   Fletcher
2007/0115009 A1   5/2007   Graefling
(Continued)

FOREIGN PATENT DOCUMENTS

KR   101117611 B1 *   3/2010   ........... G01R 19/165
TW   I440859   6/2014
(Continued)

OTHER PUBLICATIONS

"International Application Serial No. PCT/US2019/058920, International Search Report dated Feb. 16, 2020", 4 pgs.
(Continued)

*Primary Examiner* — Tung X Nguyen
*Assistant Examiner* — Robert P Alejnikov, Jr.
(74) *Attorney, Agent, or Firm* — Schwegman Lundberg & Woessner, P.A.

(57) ABSTRACT

A system current sensor module can accurately sense or measure system current flowing through a sense current resistor by shunting current through a gain-setting resistor and using an amplifier to measure a resulting voltage, with an output transistor controlled by the amplifier controlling current through the gain setting resistor in a manner that tends to keep the amplifier inputs at the same voltage. The resistors can be thermally coupled to maintain similar temperatures when a system current is flowing. The thermal coupling can include conducting heat from a first resistor layer carrying the current sense resistor to a thermal cage
(Continued)

layer located beyond a second resistor layer carrying the gain-setting resistor. This preserves accuracy, including during aging.

22 Claims, 5 Drawing Sheets

(58) Field of Classification Search
USPC .......................................................... 324/126
See application file for complete search history.

(56) References Cited

U.S. PATENT DOCUMENTS

| | | | |
|---|---|---|---|
| 2011/0291741 A1* | 12/2011 | Mayer | H01L 23/5228 327/512 |
| 2012/0218022 A1 | 8/2012 | Lazarov et al. | |
| 2014/0266841 A1 | 9/2014 | Mayer et al. | |

FOREIGN PATENT DOCUMENTS

| | | |
|---|---|---|
| TW | 202033970 A | 9/2020 |
| WO | WO-2020096840 A1 | 5/2020 |

OTHER PUBLICATIONS

"International Application Serial No. PCT/US2019/058920, Written Opinion dated Feb. 16, 2020", 6 pgs.

Martin, Drinovsky, et al., "High Voltage Coil Current Sensor for DC-DC Converters Employing DDCC", Radioengineering 24, No. 4 (2015): 989, (Dec. 31, 2015).

Regan, Tim, et al., "Current Sense Circuit Collection", Making Sense of Current (2005), (Dec. 31, 2005).

"International Application Serial No. PCT/US2019/058920, International Preliminary Report on Patentability dated May 20, 2021", 8 pgs.

"Taiwanese Application Serial No. 108139878, First Office Action dated Apr. 11, 2022", w/ English Machine Translation, 20 pgs.

\* cited by examiner

LOW TEMPERATURE COEFFICIENT CURRENT SENSOR

CLAIM OF PRIORITY

This patent application is a U.S. National Stage Application which claims priority to PCT Application Serial No. PCT/US2019/058920, filed on Oct. 30, 2019, and published as WO 2020/096840 A1 on May 14, 2020, and entitled INTEGRATED LOW TEMPERATURE COEFFICIENT CURRENT SENSOR, which claims the benefit of priority of U.S. Provisional Patent Application Ser. No. 62/755,881 entitled INTEGRATED LOW TEMPERATURE COEFFICIENT CURRENT SENSOR, which was filed on Nov. 5, 2018, which are hereby incorporated herein by reference in their entirety.

TECHNICAL FIELD

This document pertains generally, but not by way of limitation, to an electrical current sensor, and more particularly, but not by way of limitation, to a laminate-based "zero" temperature coefficient current sensor.

BACKGROUND

Sensing large currents on a printed circuit board (PCB), such as can be found at the 12V DC input to a server or network switch, can require using a sense element that is capable of passing large currents safely and with minimal power loss. For sensing input currents in excess of 100 amperes, a sense element resistance on the order of 100 $\mu\Omega$ or less may be needed. Such a sense element can come in the form of a discrete sense resistor, such as can be soldered to the PCB, or even a resistor formed by the resistance of a PCB trace itself. The voltage developed across the sense resistance can be measured using an analog-to-digital converter (ADC) in the system, which can be further conditioned or signal-processed to produce a value indicating the sensed current (e.g., in Amperes) representing the current through the sense element.

Discrete sense resistors having low temperature coefficients tend to be made from exotic materials, such as iron-chrome or manganese-copper alloys. These exotic materials can achieve a low temperature coefficient of resistance (TCR) but can be expensive. Accurately sensing the voltage across such a sense resistor element can also be difficult, given the large current (resulting in ohmic "IR" voltage drops across the PCB) and a small voltage drop across the sense resistor being used as the current sense element, as is needed to maintain a reasonable power dissipation in the sense resistor. Some Kelvin-sense resistors are available, such as can include sense points integrated into the sense resistor, but these tend to be even more expensive.

Another way of sensing large currents is by using a section of a copper PCB trace itself as the current sense element. This has the advantage that the PCB trace already exists on the PCB and no additional voltage drops (such as due to a discrete sense element) need to be introduced. However, copper has a large TCR (3900 ppm/° C.). Thus, as the PCB changes temperature, either due to ambient temperature changes or due to the power dissipation from the IR drop across the copper trace, the absolute resistance of the sense element will change. While this effect can be compensated, such as by using a temperature sensor near the sense element and some analog or digital signal conditioning in the measurement circuitry, such temperature compensation involves additional complexity.

Furthermore, the accuracy of a discrete current sense resistor, or the thickness and width of the PCB trace, may not be controlled well enough to achieve the desired final system accuracy. Trim techniques can be applied to the final PCB assembly, but this adds test cost and complexity to the PCB manufacturing process, assuming that the current can be externally measured or applied accurately enough to achieve the desired trim target.

SUMMARY

The present document explains how a system current sensor module can be provided to accurately sense or measure system current flowing through a current sense resistor. The present approach can include shunting current through a gain-setting resistor and using an amplifier to measure a resulting voltage. An output transistor can be controlled by the amplifier, such as for controlling current through the gain setting resistor, such as in a manner that tends to keep the amplifier inputs at the same voltage. The current sense resistor and the gain setting resistor can be thermally coupled, such as to help maintain similar temperatures in the sense current resistor and the gain setting resistor when a system current is flowing. For example, the thermal coupling can include conducting heat from a first resistor layer (e.g., carrying the current sense resistor) to a thermal cage layer that can be located beyond a second resistor layer (e.g., carrying the gain-setting resistor). This can help preserve current sensing and measurement accuracy, in spite of thermal effects, including thermal effects due to aging of the part. Trim adjustment techniques, such as for calibration, are also described in this document. This summary/overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

The patent or application file contains at least one drawing executed in color. Copies of this patent or patent application publication with color drawing(s) will be provided by the Office upon request and payment of the necessary fee.

DETAILED DESCRIPTION

Current Sensing Circuit Architecture

Figure 1:
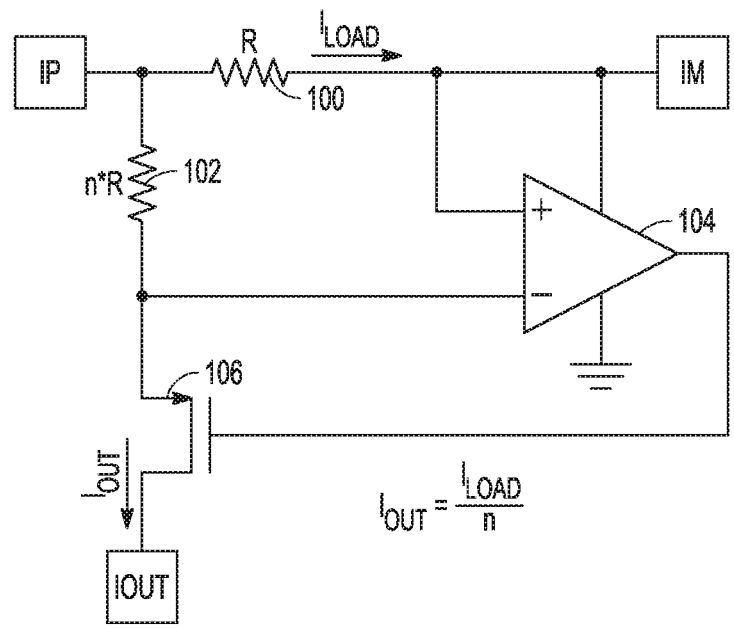
FIG. 1 shows an example of a current sense amplifier architecture.

The present approach can help overcome the problems explained above. FIG. 1 shows an example of a current sense amplifier architecture. In FIG. 1, the current "sense" resistor 100 between the "IP" terminal and the "IM" terminal, having resistance value of R (e.g., on the order of 100 µΩ or less), can serve as the primary current sense element. The large "system current" from the system flows through this current sense resistor 100. A "gain-setting" resistor 102 can be electrically connected or coupled between the "IP" terminal and the inverting input of the amplifier 104. The gain setting resistor 102 can have a resistance value of n·R, such that the resistances of the current sense resistor 100 and the gain-setting resistor 102 can be scaled with respect to each other by a specified amount, such as can be specified by a scaling factor n. The non-inverting input of the amplifier 104 can be coupled to the "IM" terminal of the amplifier 104, which node can optionally also be used to supply power to the amplifier 104 (or the amplifier 104 can be powered via a different or separate power supply rail, if desired). The output terminal of the amplifier 104 can be coupled to the gate of a p-channel or other field-effect transistor (FET) or other transistor 106, such as can be located in series between the gain-setting resistor 102 and the "IOUT" terminal. Such an arrangement can allow the amplifier 104 to close the loop in such a way to force the same voltage across the gain-setting resistor 102 as appears across the current sense resistor 102, by virtue of the virtual-ground that exists between the non-inverting and inverting inputs of the amplifier 104 when the amplifier 104 is operated in such a closed-loop manner, such as shown in the example of FIG. 1. In doing so, a scaled sensed current $I_{OUT}=[I_{LOAD}/n]$ flows out the IOUT terminal or port. This current, $I_{OUT}$, is proportional to the current flowing from the IP terminal to the IM terminal.

If both the current sense resistor 100 and the gain-setting resistor 102 are constructed from the same material (e.g., copper, on a laminate substrate), and are at the same temperature, the temperature coefficient of resistance (TCR) of either of the current sense resistor 100 or the gain-setting resistor 102 does not matter in terms of the impact on the scaled sensed current $I_{OUT}$. The ratio of the resistance values of the current sense resistor 100 and the gain-setting resistor 102 remains the same (e.g., "n") regardless of changes in their absolute resistance values due to temperature and their respective TCRs.

The two primary error sources in the architecture shown in FIG. 1 are an error in the resistance ratio between the current sense resistor 100 and the gain-setting resistor 102, and an error due to the input offset voltage of the amplifier 104. The resistance ratio is determined by the physical construction of the sense resistor 100 and the gain-setting resistor 102, and the tolerances involved in manufacturing these resistors (e.g., such as which can arise from a copper etch variation, or copper thickness variation). Adjusting or "trimming" the gain to account for the resistor ratio (n) errors can be achieved in one or more of several different ways.

Figure 2:
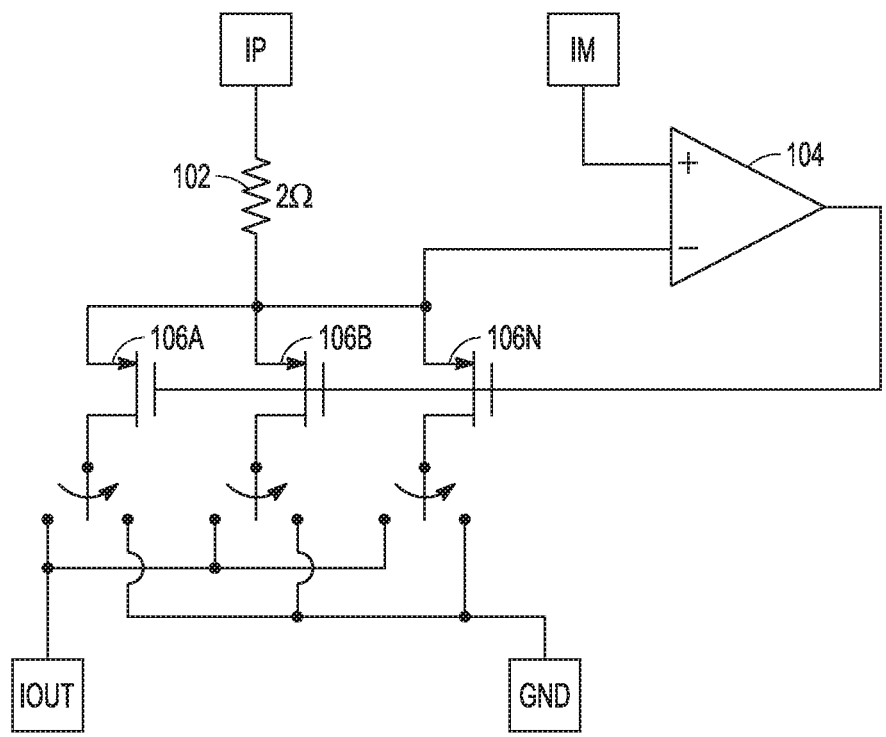
FIG. 2 is a circuit schematic diagram that shows an approach of trimming gain.

FIG. 2 is a circuit schematic diagram that shows an example of an approach of trimming gain. In FIG. 2, the PFET 106 can be split into multiple parallel PFET segments 106A, . . . , 106N, such as with individually addressable and switchable drain terminals. At manufacturing, trimming can be accomplished by selectably switching a certain number of the drains of those PFET segments 106A-N to supply the $I_{OUT}$ current to the terminal IOUT, with the drains of the other PFET segments 106A-N being selectably switched, such as to selectably direct their respective source-drain currents to some node other than IOUT, such as to a GND terminal, such as shown in the example of FIG. 2.

In another example, adjusting or trimming the gain can be achieved such as by placing a large value shunt resistor in parallel to the gain-setting resistor 102 of resistance value n·R, or a portion thereof, and then selecting a tap point on that large value shunt resistor for coupling to the inverting input to the amplifier 104. This has the effect of taking a fraction of the voltage across the gain-setting resistor 102 of resistance value n·R to use as the feedback resistance value for the amplifier 104. As long as the fraction used of the large value shunt resistor remains stable with temperature and over time, the gain adjustment will remain stable.

Figure 3:
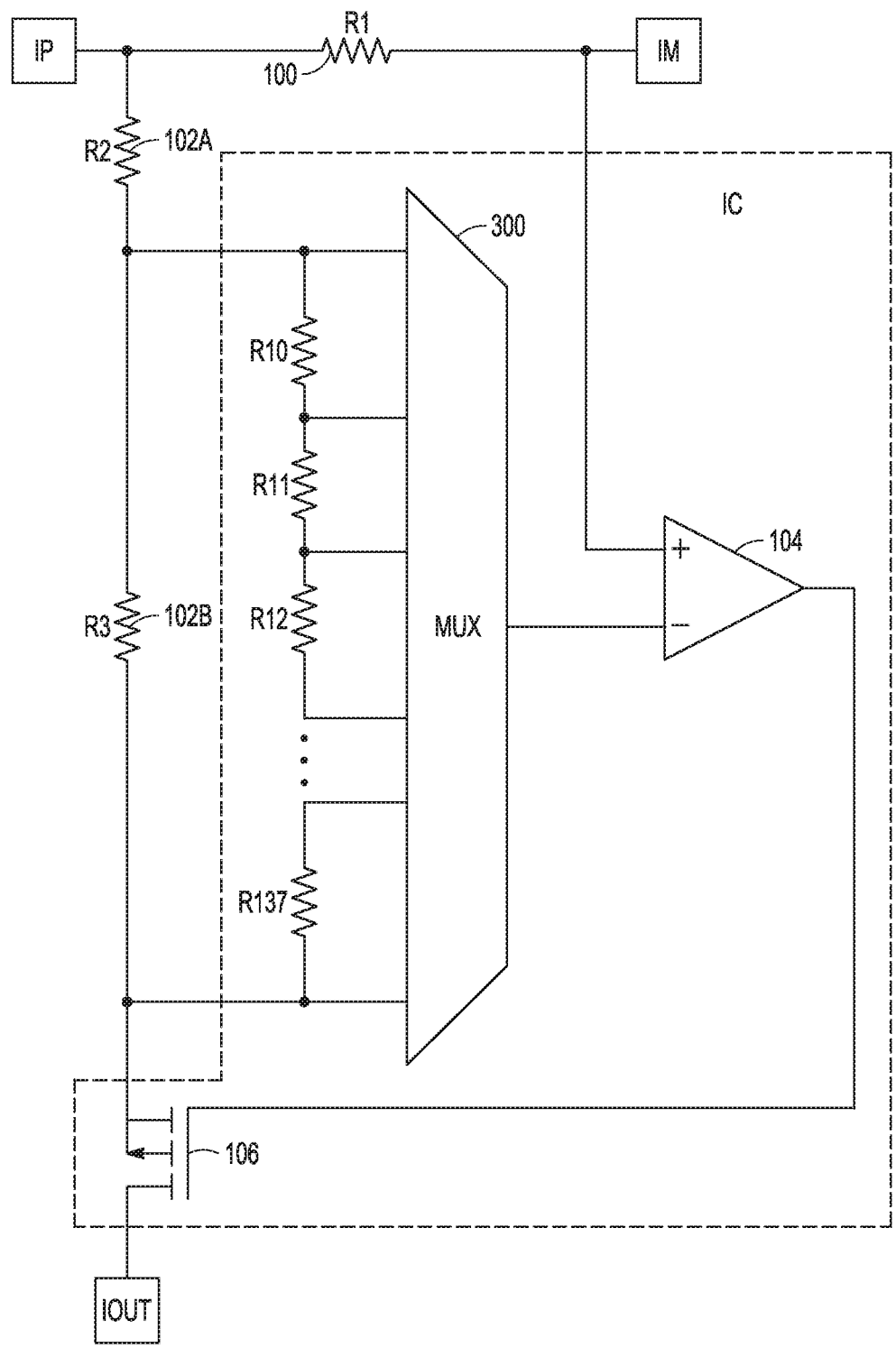
FIG. 3 shows an example in which the gain setting resistor can be formed from at least two series components R2 and R3, at least one of which can include or be coupled to a larger resistance shunt resistor in parallel.

FIG. 3 shows an example in which the gain setting resistor 102 can be formed from at least two series resistance components R2 and R3, at least one of which (e.g., R3) can include or be coupled to a larger resistance shunt resistor in parallel. For example, such parallel shunt resistor can include the series combination of R10, R11, R12, . . . , R137. In FIG. 3, the larger resistance shunt resistor providing tap points can be selectively coupled to the inverting input of the amplifier 104, such as via a multiplexer circuit 300. In the example of FIG. 3, the large shunt resistor can include an interpolation string such as a series combination of resistors, e.g., R10, R11, R12, . . . , R137 with tap points provided between or across such individual resistors R10, R11, R12, . . . , R137 for allowing such individual tap points to be selectively multiplexed to the inverting input of the amplifier 104. The gain-setting resistor 102 component 102A can have a resistance value of (n−m)·R and the gain-setting resistor 102 component 102B can have a resistance value of m·R, such that the sum of these resistance values is equal to the resistance n·R of the gain-setting resistor 102 of FIG. 1. The series resistance value of the interpolation string formed by series combination of resistors, e.g., R10, R11, R12, . . . , R137 can be set to be much larger than the resistance value m·R of the component 102B of the gain-setting resistor 102 IOUT in parallel therewith, such that only a small fraction of the current through 102B flows through the series combination of resistors, e.g., R10, R11, R12, . . . , R137. The approach shown in FIG. 3 has the benefit that the output current at the node or port $I_{OUT}$ is precise and no current (e.g., beyond that used to power the amplifier 104) need be shunted to ground during current sensing and measurement, such as was shown in the approach of FIG. 2.

Thermal Stability

Figure 4:
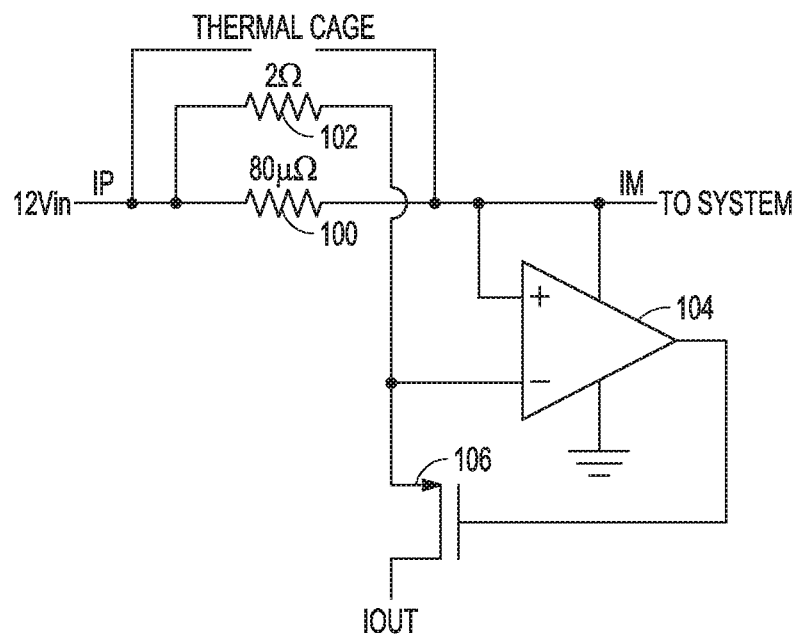
FIG. 4 illustrates a circuit schematic example of forming a thermal cage.

The present inventors have recognized, among other things, that it can be helpful to keep the two resistors (e.g., the sense resistor 100 of resistance R and the gain-setting resistor 102 of resistance n·R) at the same temperature, such as to help maintain a stable gain n over temperature and to help reduce errors due to aging. Since the largest power dissipation will occur in the primary sense resistor 100 of resistance R (which can have the full, large, system current flowing through it), the gain setting resistor 102 of resistance n·R can be constructed so as to be thermally coupled to the sense resistor 100, such that both of these resistors 100, 102 are at about the same temperature and experience the same temperature variations. This can include forming a "thermal cage" to help keep the sense resistor 100 and the gain-setting resistor 102 at the same temperature, such as shown in the schematic example of FIG. 4. In the illustrative, non-limiting example of FIG. 4, the current sense resistor 100 is shown as having a resistance value of R=80 microOhms and the gain-setting resistor 102 is shown as having a resistance value of n·R=2 Ohms. For example, a technique of thermally coupling the sense resistor 100 and the gain-setting resistor 102 can include forming both such resistors 100, 102 on the same PCB layer, such as side-by-side, or such as with one of the resistors 100, 102 being encompassed or peripherally surrounded by the other of the resistors 100, 102.

Figure 5:
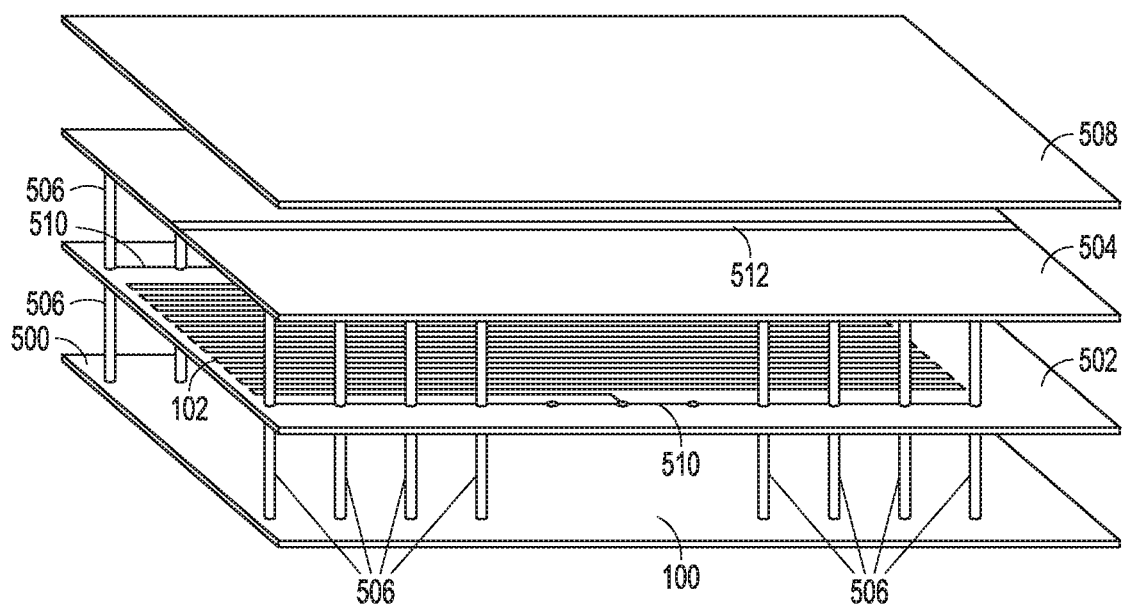
FIG. 5 shows an pictorial example of a layered thermal cage technique of thermally coupling the sense resistor and the gain-setting resistor

FIG. 5 shows a pictorial example of a technique of forming a layered thermal cage for thermally coupling the sense resistor 100 and the gain-setting resistor 102, such as which can include forming the gain setting resistor 102 on a layer of the PCB that is adjacent to, and stacked vertically against, a layer of the PCB on Which the sense resistor 100 is formed.

To help ensure sufficient thermal coupling between the sense resistor 100 and the gain-setting resistor 102, a thermal "cage" can be provided around the gain setting resistor 102. In FIG. 5, such a thermal cage is shown as being constructed by sandwiching the layer 502 upon which the gain-setting resistor 102 is formed between the layer 500 upon which the sense resistor 100 is formed and a superjacent or overlaying thermally conductive cage layer 504. The thermally conductive cage layer 504 can be located or positioned in layered-registration with the area region occupied by the underlying sense resistor 100. The thermally conductive cage layer 504 can be relatively more thermally conductive than either or both of the layers 500, 502. The PCB layers 500 and 502 upon Which the sense resistor 100 and gain-setting resistor 102 are formed can include one or more thermally conductive vias 506, such as can quickly and efficiently conduct heat from the sense resistor layer 500 to the thermal cage layer 504. Like the thermally conductive cage layer 504, the thermally conductive vias 506 can be relatively more thermally conductive than either or both of the layers 500, 502. In this way, heat from the sense resistor 102 can be transmitted through the thermally conductive vias 506 to the thermally conductive cage layer 504, and then planarly spread across the gain-setting resistor 102 in all directions (such as via the planar thermal conductor provided by the thermal cage layer 504). This can help provide good thermal coupling between the sense resistor 100 and the gain-setting resistor 102. An electrically insulating gap 512 can be provided, such as between electrically and thermally conductive portions of the thermal cage layer 504, such as to avoid electrically shorting either or both of the sense resistor 100 or the gain-setting resistor 102 through electrical conduction through the vi as 506 and through the thermal cage layer 504, which could otherwise occur in the absence of such a gap 512.

Figure 6:
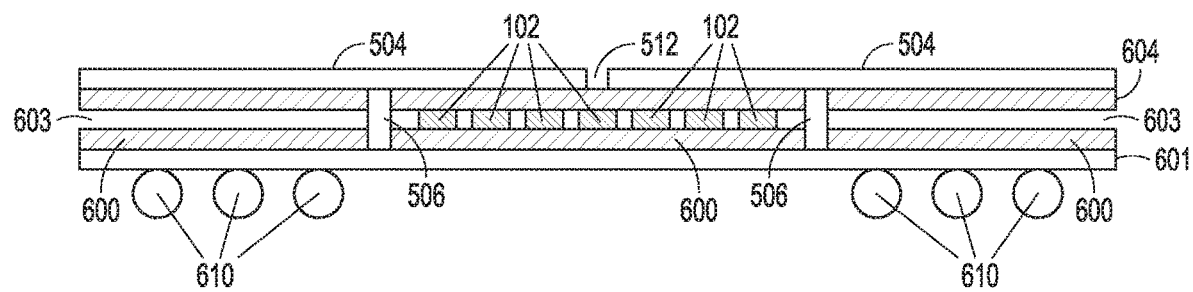
FIG. 6 shows a cross-sectional view further illustrating certain aspects of FIG. 5.

FIG. 6 shows a cross-sectional view further illustrating or building upon certain aspects of FIG. 5. In the example of FIG. 6, the current sense resistor 100 of resistance R is shown as the copper (or other electrically conductive) shunt layer 601 facing toward the bottom of the layered structure as shown in FIG. 6, such as can be mounted and connected to desired regions of an underlying motherboard PCB, such as via the solder balls 610 shown in FIG. 6. This copper shunt layer 601 can be formed upon an insulating PCB substrate material layer 600 (e.g., FR-4 fiberglass-reinforced epoxy laminate material, or BT-epoxy insulating laminate substrate material). In FIG. 6, the combination of the copper sense resistor layer 601 formed upon the insulating substrate material layer 600 is shown after being turned over such that the copper shunt layer 601 is facing toward the bottom of the layered structure of FIG. 6, and after thermally conductive (e.g., copper or the like) vias 506 have been formed at desired locations (see, e.g., FIG. 5) through the insulating substrate material layer 600, on the other side of which the larger-resistance (serpentine or other shape) gain-setting resistor 102 has been formed in (or placed against) a layer 603. The thermally conductive vias 506 can further extend through a second insulating substrate material layer 604 (e.g., PCB or laminate) that can be located above the gain-setting resistor layer 603, with the gain-setting resistor layer 603 formed or placed against the underside of such second insulating substrate layer 604. In FIG. 6, above and upon the second insulating substrate layer 604 a thermally conductive (e.g., copper or the like) thermal cage layer 504 material can be formed, such as with an electrically non-conductive gap 512 formed therein, such as explained above. Because the large system current flows through the current sense resistor 100, it will generate heat in the current sense resistor layer 601. Such generated heat can be thermally conducted via the thermally conductive vias 506 to the thermally conductive thermal cage layer 504 material. This can spread the heat of the current sense resistor 100, such as to surround the gain-selling resistor 102 from above and below, thereby thermally coupling the current sense resistor 100 and the gain-setting resistor 102. As shown in FIG. 5, a further PCB layer 508 can be placed above the thermal cage layer 504 (or above the layer 504 as shown in FIG. 6), and such further PCB layer 508 can be selectively configured with electrically conductive traces, pads, or the like, such as within or to which other components can be located or placed upon. For example, the amplifier 104, decoupling capacitors, the FET or other transistor 106, a power supply voltage regulator, or one or more other components can be mounted to such a further PCB layer 508. Further, as shown in FIG. 6, the entire assembly can optionally be packaged into a component module and can be mounted via the solder balls 610 or other technique to a further motherboard PCB or other component of a system, as desired.

FIG. 5 also shows examples of linear electrically and thermally conductive side or end traces 510, such as on two or more (e.g., four) opposing sides of the serpentine gain-setting resistor 102. In an example, the thermally conductive vias 506 can pass vertically through such side or end traces 510 between layers, such as at recurrent, periodic, or closely spaced locations through the insulating layers 600, 602. This can help promote fast and uniform heat conduction from the current sense resistor 100 to the thermal cage layer 504, which can help keep the intervening gain-setting resistor 102 at the same or a very similar temperature to that of the current sense resistor 100. Examples of thicknesses involved in the structures shown and described with respect to FIGS. 5-6 can include 35-50 micrometer thick insulating laminate layers, with 20-30 micrometer thick thermally and electrically conductive metal layers, such as shown, such as to yield a total component thickness of approximately 320 micrometers. A similar approach can use thicker PCB layers instead of thinner laminate layers, with a total component thickness of approximately 1/16 inch.

Because the current sense resistor 100 and the gain-setting resistor 102 can be thermally-coupled, such as using a thermal cage approach such as shown and described herein, these resistors 100, 102 will be at similar temperatures during operation, and this will be true over the usable operational life of the component as well. Therefore, any component aging effects of the resistors 100, 102 that depend upon temperature or temperature cycling will affect these resistors 100, 102 similarly. However, since the current sensing and measurement accuracy depends upon the ratio of these two resistance values of the resistors 100, 102, such temperature-dependent aging effects should affect both of these resistors 100, 102 equally or similarly, but component aging is not expected to affect the ratio of these resistance values, thereby helping preserve accuracy of the current sensing and measurement as the component or assembly ages.

Figure 7:
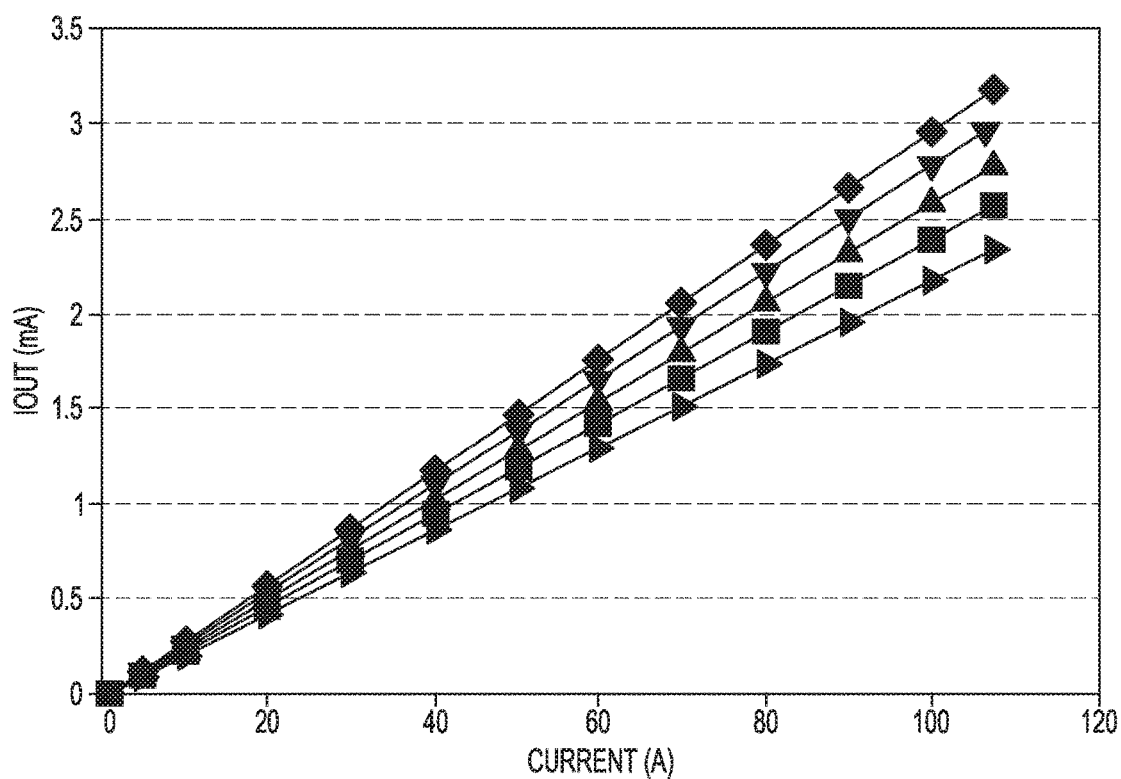
FIG. 7 shows an example of prototype experimental test results of output current, Iout (in milliamperes) measured at the terminal IOUT vs. system current (amperes) between terminals IP and IM for five different prototype parts.

FIG. 7 shows an example of prototype experimental test results of output current, Iout (in milliamperes) measured at the terminal IOUT vs. system current (amperes) flowing between terminals IP and IM, for five different prototype parts.
This shows good linearity, but some gain error related to the physical matching between the current sense resistor 100 (of resistance R) and the gain-setting resistor 102 (of resistance n·R).

Figure 8:
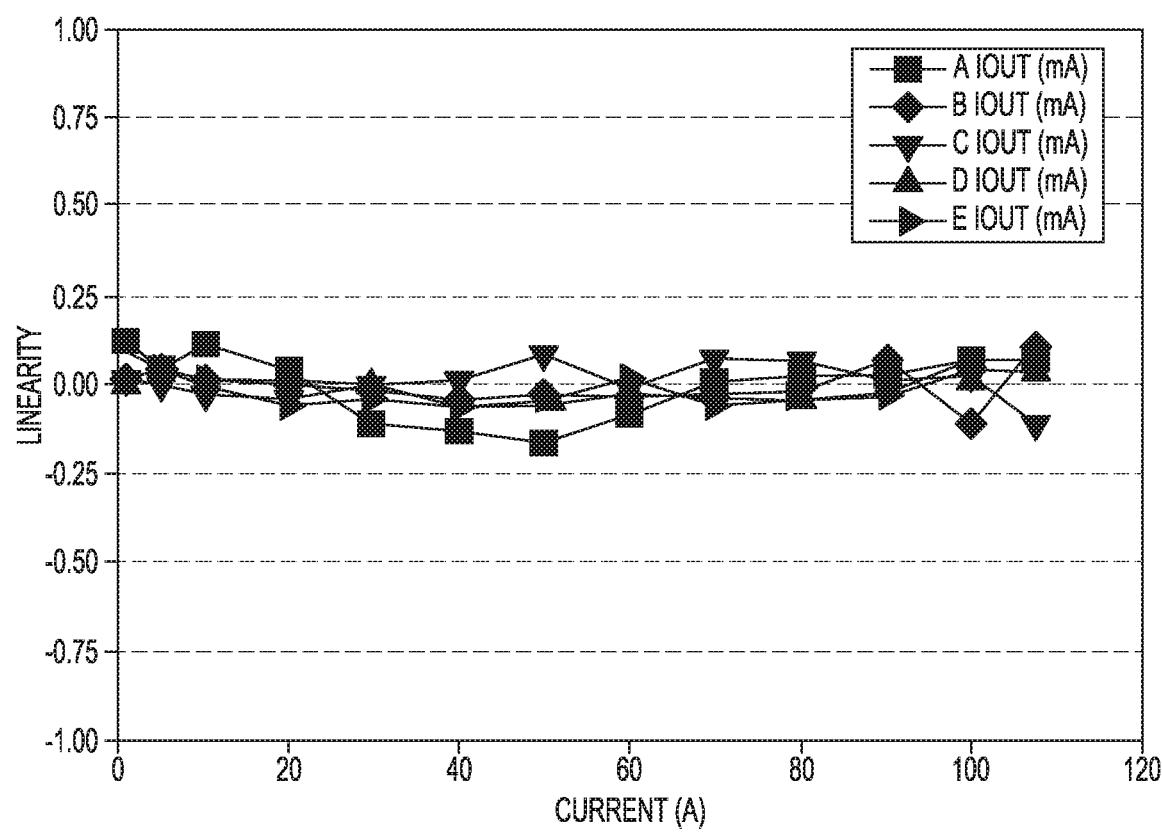
FIG. 8 shows an example—after trimming such as described herein—of such prototype experimental parts, with the y-axis of the graph representing percent error to an ideal straight line fit of output current, Iout, (in milliamperes) vs. the x-axis representing system current (amperes) between terminals IN and OUT for five different prototype parts.

FIG. 8 shows an example of a graph of results of testing of such prototype experimental parts, with the y-axis of the graph representing percent error to an ideal straight line fit of output current, Iout, (in milliamperes) vs. the x-axis representing system current (amperes) between terminals IP and IM, for five different prototype parts. The data shown in FIG. 8 shows good linearity.

Some Examples of Other Variations, Applications, or Uses

Since all the circuitry shown in the example of FIG. 1 "rides along" relative to the IP/IM voltage rail (e.g., the upper power supply rail of the amplifier 104 is biased by the IM terminal, and the lower power supply rail of the amplifier 104 is at GND and the IOUT terminal can also be biased as desired with respect to the upper power supply rail of the amplifier 104), the current sense circuitry of FIG. 1 can be placed anywhere in a particular system. Although primarily shown in FIG. 1 as intending to provide high-side current sense circuitry, a similar current sense architecture and circuitry can be used to provide low-side (or even negative voltage) current sensing, such as with proper biasing of the amplifier 104 circuit shown in FIG. 1. The output current at the terminal IOUT can be configured to either source or sink current, again with proper biasing of the amplifier 104 circuit and proper selection of transistor 106 type (e.g., NFET vs. PFET).

The circuit shown in the example of FIG. 1 can operate independently of voltage between IP/IM and GND. So long as the amplifier 104 (or a voltage regulator powering the amplifier 104) and the output transistor 106 can stand off the voltage between IP/IM and GND, and there is sufficient voltage headroom to allow the amplifier 104 and output FET 106 to operate, the circuit shown in the example of FIG. 1 can be used with any upper voltage rail, including 12V, 48V, 54V, or even 300V or higher.

An additional resistor can optionally be included between IOUT and GND, such as can permit the circuit shown in the example of FIG. 1 to output a voltage (e.g., taken across all or a portion of such additional resistor) instead of a current. Additionally, the IOUT output current can be digitized, such as by including an analog-to-digital converter circuit on the device with the circuit shown in the example of FIG. 1, such that a digital output, representative of such current, can be generated. This can help permit one or more other quantities, such as input voltage, power, or energy to also be measured and calculated.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description. The term "coupled" can include both direct and indirect electrical interconnections that can be regarded as providing the described operative functional coupling.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like, Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the all upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims or aspects are hereby incorporated into the Detailed Description as examples or embodiments, with each claim or aspect standing on its own as a separate embodiment, and it is contemplated that such embodiments can be combined with each other in various combinations or permutations. The scope of the invention should be determined with reference to the appended claims or aspects, along with the full scope of equivalents to which such claims or aspects are entitled.

The claimed invention is:

1. A system current sensor module for accurately performing at least one of a current sensing or measurement of a system current, the sensor module comprising:
   an input node, an output node, and a system current test node;
   a first resistor coupled between the input and output nodes;
   a second resistor coupled between the input node and the test node;
   an output transistor in series between the second resistor and the test node;
   an amplifier, including a first amplifier input coupled to the output node, a second amplifier input coupled to the second resistor, and an amplifier output coupled to a control node of the transistor; and
   wherein the second resistor comprises tap locations selectively coupled to the second amplifier input, and
   wherein the first and second resistors are thermally coupled to keep a temperature of the second resistor at or near a temperature of the first resistor when a system current is flowing through the first resistor and heating the first resistor.

2. The current sensor module of claim 1, comprising a thermal cage thermally coupling the first and second resistors, the thermal cage including:
   a thermally conductive sheet located on a first side of a second resistor sheet layer carrying the second resistor; and
   a first resistor sheet layer, carrying the first resistor, located on an opposing second side of the second resistor sheet layer, carrying the second resistor, from the thermally conductive sheet.

3. The current sensor module of claim 2, further comprising one or more thermally conductive paths extending between the first resistor sheet layer and the thermally conductive sheet layer.

4. The current sensor module of claim 3, further comprising, one or more thermally insulating layers through which the one or more thermally conductive paths extend.

5. The current sensor module of claim 4, wherein the second resistor sheet layer includes laterally opposing first and second end traces through which one or more of the thermally conducting paths extend.

6. The current sensor module of claim 2, wherein the first resistor sheet layer, the second resistor sheet layer, and the thermally conductive sheet are respective printed circuit board (PCB) layers in a PCB.

7. The current sensor module of claim 1, further comprising a component layer separated from the second resistor by a thermally conductive sheet.

8. The current sensor module of claim 1, further comprising one or more solder balls or other electrical interconnections to at least one of the first and second resistors for attachment to another component, module, or printed circuit board.

9. The current sensor module of claim 8, in combination with a motherboard coupled to the current sensor module via the one or more solder balls or other electrical interconnections.

10. The current sensor module of claim 1, wherein the output transistor includes a plurality of parallel output transistors with individually selectable paths that determine which of the output transistors contribute current to the test node.

11. The current sensor module of claim 1, wherein the second resistor comprises first and second series-connected components, and wherein the second series-connected component of the second resistor comprises one or more tap locations selectively coupled to the second amplifier input.

12. The current sensor module of claim 1, wherein the second resistor comprises a first and second series-connected components, and wherein the second series-connected component of the second resistor is electrically connected in parallel with a shunt resistor that provides one or more tap locations to be selectively coupled to a second amplifier input via a multiplexer circuit.

13. The current sensor module of claim 1, wherein the first and second resistors are located in separate layers that are thermally coupled to each other.

14. The current sensor module of claim 13, wherein the separate layers include at least one of PCB layers or other laminate layers.

15. The current sensor module of claim 1, wherein the first and second resistors are located in separate layers, at least one of which is thermally coupled in an at least partially peripherally-distributed manner to an additional thermally conductive layer for distributing heat via the additional thermally conductive layer.

16. The current sensor module of claim 1, comprising a thermal cage thermally coupling the first and second resistors, the thermal cage including:
   a thermally conductive sheet located on a first side of a second resistor sheet layer carrying the second resistor; and
   a first resistor sheet layer, carrying the first resistor, located on an opposing second side of the second resistor sheet layer, carrying the second resistor, farther from the thermally conductive sheet than the second resistor sheet layer carrying the second layer.

17. The current sensor module of claim 16, wherein the first and second resistor sheet layers are thermally and electrically connected to the thermally conductive sheet layer by first and second sets of peripheral vias along corresponding first and second edges of the first and second resistor sheet layers, and wherein the thermally conductive sheet layer includes an electrically insulating portion inhibiting electrical conduction from the first set of peripheral vias to the second set of peripheral vias within the thermally conductive sheet layer.

18. A method of sensing or measuring a system current comprising:
  in response to a system current flowing between an input node and an output node via a first resistor, shunting a measurement current via a second resistor to a test node;
  measuring a voltage across the second resistor using an amplifier that is configured in a closed feedback loop to control the current through the second resistor in a manner that tends to reduce or minimize a voltage difference across first and second inputs of the amplifier; and
  wherein the measuring includes using thermally coupled first and second resistors wherein the second resistor comprises tap locations selectively coupled to the second amplifier input.

19. The method of claim 18, wherein using thermally coupled first and second resistors for conducting heat from a first resistor layer carrying the first resistor to a thermally conductive thermal cage layer located beyond a second resistor layer carrying the second resistor.

20. The method of claim 19, wherein using thermally coupled first and second resistor layers further comprises spreading heat in the thermal cage layer across a region that is located in layered registration to the second resistor.

21. A system current sensor module for accurately performing at least one of a current sensing or measurement of a system current, the sensor module comprising:
  an input node, an output node, and a system current test node;
  a first resistor and a second resistor arranged in a feedback configuration to provide a gain (n) between a system load current and a test output current based on a ratio of resistance values of the first resistor and the second resistor wherein the second resistor comprises tap locations selectively coupled to a second amplifier input of a feedback amplifier having first and second amplifier inputs; and
  means for thermally coupling the first and second resistors to keep a temperature of the second resistor at or near a temperature of the first resistor when a system current is flowing through the first resistor and heating the first resistor.

22. The sensor module of claim 21, wherein the means for thermally coupling the first and second resistors includes the first and second resistors being respectively located in separate PCB or other laminate layers that are thermally coupled to each other, and wherein the first and second resistors are thermally coupled for conducting heat from a first resistor layer carrying the first resistor to a thermally conductive thermal cage layer located beyond a second resistor layer carrying the second resistor.

* * * * *